United States Patent
Hsieh

(10) Patent No.: US 7,091,747 B2
(45) Date of Patent: Aug. 15, 2006

(54) CIRCUIT FOR TRANSLATING VOLTAGE SIGNAL LEVELS

(75) Inventor: Ming-Chih Hsieh, Tu-Cheng (TW)

(73) Assignee: HON HAI Precision Industry CO., Ltd., Tu-cheng city (TW)

( * ) Notice: Subject to any disclaimer, the term of this patent is extended or adjusted under 35 U.S.C. 154(b) by 85 days.

(21) Appl. No.: 11/021,376

(22) Filed: Dec. 23, 2004

(65) Prior Publication Data

US 2006/0006907 A1    Jan. 12, 2006

(30) Foreign Application Priority Data

Jul. 8, 2004    (CN) .................... 2004 1 0051055

(51) Int. Cl.
*H03K 19/0175*    (2006.01)
(52) U.S. Cl. ........................... 326/68; 326/83
(58) Field of Classification Search ............... 326/60, 326/62, 63, 68–74, 82, 83, 86
See application file for complete search history.

(56) References Cited

U.S. PATENT DOCUMENTS

| 5,510,731 | A | * | 4/1996 | Dingwall .................... 326/63 |
| 5,680,063 | A | * | 10/1997 | Ludwig et al. ............... 326/80 |
| 6,452,419 | B1 | * | 9/2002 | Ovens ......................... 326/80 |
| 6,738,855 | B1 | | 5/2004 | Goldman .................... 710/315 |

* cited by examiner

*Primary Examiner*—Don Le
(74) *Attorney, Agent, or Firm*—Tim Tingkang Xia, Esq.; Morris, Manning & Martin LLP

(57) ABSTRACT

A circuit (3) for translating voltage signal levels includes: a diode (D1); a first resistor (R1) with one end connected to the cathode of the diode; a metal-oxide-semiconductor field effect transistor (Q1), with the gate thereof connected to the other end of the first resistor, and the drain thereof being grounded; a second resistor (R2) with one end connected to the source of the metal-oxide-semiconductor field effect transistor; and a power supply (Vcc) connected to the other end of the second resistor. The circuit performs voltage signal level translation by the switching on and off of the MOSFET located between devices utilizing different logic signal families, without the need for a level translation IC. The circuit is simple and can save costs.

12 Claims, 1 Drawing Sheet

US 7,091,747 B2

CIRCUIT FOR TRANSLATING VOLTAGE SIGNAL LEVELS

BACKGROUND OF THE INVENTION

1. Field of the Invention

The present invention pertains to circuits for translating voltage signal levels; for example, translating RS232 voltage signal levels to Transistor-Transistor Logic (TTL) voltage signal levels.

2. Description of Prior Art

With the rapid development of communication technologies, the Electronic Industries Association (EIA) and the Telecommunication Industry Association (TIA) have developed a number of standards to simplify data communication. The RS232 standard is one of the most widely known communication standards. Voltage levels of voltage signals that conform to the RS232 standard range from −12V to +12V. Nowadays digital technology is widely used, and this needs to implement logic signal families that have voltage levels different from that of the RS232 voltage signals. Most logic signal families utilize narrower and single-sign voltage levels. Voltage signals in these logic signal families are compatible with the operation requirements of Metal Oxide Semiconductor (MOS) transistors, and exhibit reduced noise levels typically encountered in existing digital technologies. One of such logic signal families is the TTL signal family, which recognizes voltage signals ranging from 0 to +5V.

Because the voltage range of RS232 voltage signals is different from that of TTL voltage signals, the RS232 voltage signals and the TTL voltage signals are incompatible. Therefore, devices utilizing the RS232 standard (RS232 devices) cannot communicate with devices utilizing the TTL signal family (TTL devices), at least not directly.

Although communication technology is gradually moving away from the RS232 standard, this standard is still employed in a wide variety of applications. Intermediate devices for permitting the RS232 devices to communicate with the TTL devices by translating voltage signal levels are needed.

Conventional devices for translating voltage signal levels are level translation ICs. These ICs translate voltage signal levels between RS232 devices and TTL devices in order to permit the RS232 devices to communicate with the TTL devices. Thus, when TTL voltage signals are transmitted from a TTL device to the level translation IC, the level translation IC converts the TTL voltage signals to RS232 voltage signals, and sends the RS232 voltage signals to the RS232 device. Conversely, when RS232 voltage signals are transmitted from the RS232 device to the level translation IC, the level translation IC converts the RS232 voltage signals to TTL voltage signals, and sends the TTL voltage signals to the TTL device. The level translation IC commonly employed for this purpose needs to be connected to both a +5V power supply and a +12V power supply.

Although level translation ICs are suitable for some applications to perform bidirectional voltage level translations between TTL voltage signals and RS232 voltage signals, they have a number of disadvantages. First, level translation ICs are relatively expensive and complex, and are particularly cost-inefficient in systems where they only perform voltage level translation between RS232 voltage signals and TTL voltage signals. Second, a conventional level translation IC must be connected to the power supplies of both the RS232 device and the TTL device in order to perform voltage level translation.

Therefore, there is a need for a simple and inexpensive circuit to translate voltage signal levels and permit communication among devices utilizing different logic signal families.

SUMMARY OF THE INVENTION

An objective of the present invention is to provide a circuit for translating voltage signal levels, the circuit permitting communication among devices utilizing different logic signal families without the need for a level translation IC.

In order to fulfill the above-mentioned objective, the present invention provides a circuit for translating voltage signal levels. The circuit comprises: a diode; a first resistor with one end connected to the cathode of the diode; a Metal-Oxide-Semiconductor Field Effect Transistor (MOSFET), with the gate thereof connected to the other end of the first resistor, and the drain thereof being grounded; a second resistor with one end connected to the source of the MOSFET; and a power supply connected to the other end of the second resistor.

The circuit of the present invention performs voltage signal level translation by the switching on and off of the MOSFET located between devices utilizing different logic signal families, without the need for a level translation IC. The circuit is simple and can save costs.

Other objects, advantages and novel features of the present invention will become more apparent from the following detailed description when taken in conjunction with the accompanying drawings, in which:

DETAILED DESCRIPTION OF THE INVENTION

Figure 1:
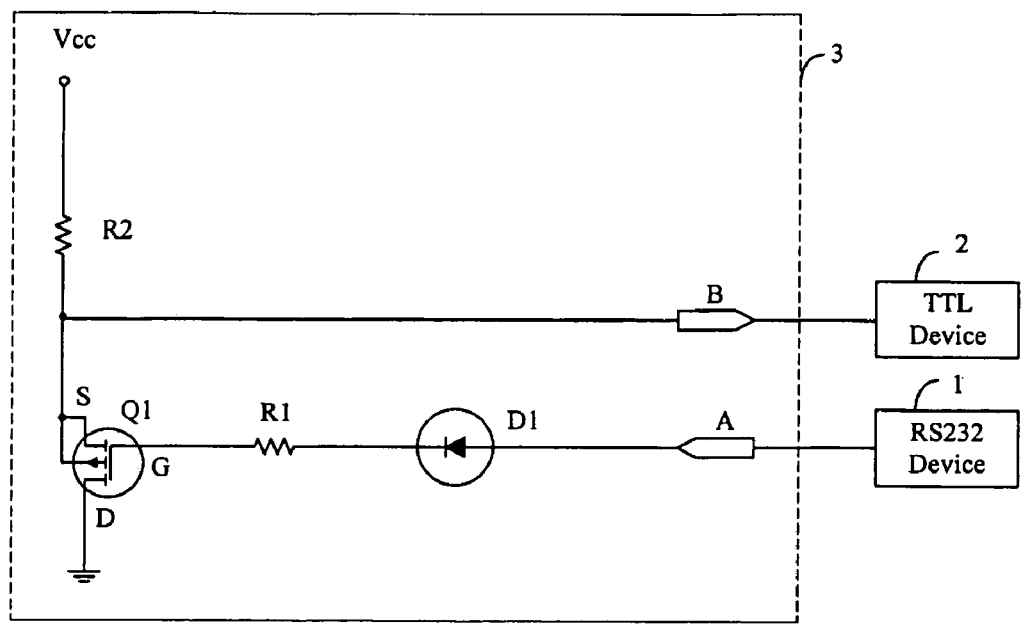
FIG. 1 is a circuit diagram of an operating environment of a circuit for translating voltage signal levels according to a preferred embodiment of the present invention.

FIG. 1 is a circuit diagram of an operating environment of a circuit 3 for translating voltage signal levels according to the preferred embodiment of the present invention. In the preferred embodiment, an RS232 device 1 utilizes RS232 voltage signals ranging from −12V to +12V, while a Transistor-Transistor Logic (TTL) device 2 utilizes TTL voltage signals ranging from 0 to +5V. Even more preferably, the TTL voltage signals range from 0 to +3.3V. The circuit 3 is connected to the RS232 device 1 through an input end A, and is connected to the TTL device 2 through an output end B. The circuit 3 translates the RS232 voltage signals input from the RS232 device 1 into the TTL voltage signals, and then sends the TTL voltage signals to the TTL device 2, thereby providing communication between the RS232 device 1 and the TTL device 2.

The circuit 3 accomplishes voltage signal level translation by the switching on and off of a Metal-Oxide-Semiconductor Field Effect Transistor (MOSFET) Q1 located between the RS232 device 1 and the TTL device 2 and having three connecting ends of a gate G (control end), a source S and a drain D. The circuit 3 comprises the input end A for receiving the RS232 voltage signals ranging from −12V to +12V input from the RS232 device 1, a diode D1 as one switch, a first resistor R1, the MOSFET Q1 as the other switch, a second resistor R2, a power supply Vcc for providing a +3.3V voltage, and the output end B for outputting the TTL voltage signals ranging from 0 to +3.3V to the TTL device 2. The anode of the diode D1 is connected to the input end A, and the cathode of the diode D1 is connected to the gate G of the MOSFET Q1 through the first resistor R1. The drain D of the MOSFET Q1 is grounded. The source S of the MOSFET Q1 is connected to the power supply Vcc through the second resistor R2, and is also connected to the TTL device 2 through the output end B. A voltage of the power supply Vcc is equal to a voltage of the TTL voltage signals output by the output end B. In the preferred embodiment, the resistance of each of the resistors R1 and R2 is 4.7KΩ. In an alternative embodiment of the present invention, the voltage of the power supply Vcc ranges from 0 to +5V.

Figure 2:
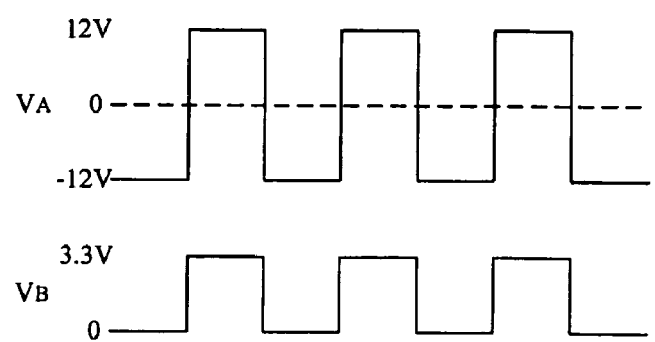
FIG. 2 is a schematic diagram illustrating voltage signal level translation performed by the circuit of FIG. 1.

FIG. 2 is a schematic diagram illustrating voltage signal levels translation performed by the circuit 3. In the preferred embodiment, the voltage signal level translation is accomplished by the switching on and off of the MOSFET Q1. When the input end A receives a −12V RS232 voltage signal, the diode D1 is turned off, and a cathode voltage of the diode D1 is 0. Thus, a gate voltage of the MOSFET Q1 is 0. Because an instantaneous source voltage of the MOSFET Q1 is equal to the voltage of the power supply Vcc, a gate-source voltage $V_{GS}$ of the MOSFET Q1 is −3.3V. In the preferred embodiment, the MOSFET Q1 is an NDS352AP type, whose threshold voltage $V_{GS(th)}$ is −2.5V. Because the gate-source voltage $V_{GS}$ of the MOSFET Q1 is lower than the threshold voltage $V_{GS(th)}$ of the MOSFET Q1, the MOSFET Q1 is turned on, and current flows from the source S to the drain D. The drain D is grounded, so the source voltage is 0. Therefore, voltage on the output end B is 0, and the second resistor R2 bears the voltage of the power supply Vcc.

When the input end A receives a +12V RS232 voltage signal, the diode D1 is turned on. The gate voltage of the MOSFET Q1 is +12V if voltage across the diode D1 is ignored. Because the instantaneous source voltage of the MOSFET Q1 is +3.3V, the gate-source voltage $V_{GS}$ of the MOSFET Q1 is +8.7V, which is higher than the threshold voltage $V_{GS(th)}$ of the MOSFET Q1. Thus, the MOSFET Q1 is turned off, and no current flows between the source S and the drain D. In such case, the voltages on the source S and the output end B are both equal to the voltage of the power supply Vcc. Thus, the voltage on the output end B is +3.3V. In this way, the circuit 3 accomplishes translation of the +/−12V RS232 voltage signals into the 0 or +3.3V TTL voltage signals.

In the preferred embodiment, the resistors R1 and R2 are used for ensuring that the gate-source voltage $V_{GS}$ of the MOSFET Q1 is positive when the input end A receives the +12V RS232 voltage signal, and that the gate-source voltage $V_{GS}$ of the MOSFET Q1 is negative when the input end A receives the −12V RS232 voltage signal. In addition, the resistors R1 and R2 are employed as current limiting devices to avoid burning out of the MOSFET Q1. The diode D1 must bear its maximum input reverse voltage −12V, and the MOSFET Q1 must bear the maximum input reverse voltage across the diode D1. In the preferred embodiment, the diode D1 is a 1N4148 type, and the MOSFET Q1 is the NDS352AP type that is a P-channel insulated gate field effect transistor.

While preferred embodiments of the present invention have been described above, it should be understood that they have been presented by way of example only and not by way of limitation. Thus the breadth and scope of the present invention should not be limited by the above-described exemplary embodiments, but should be defined only in accordance with the following claims and their equivalents.

What is claimed is:

1. A circuit for translating voltage signal levels, comprising:
    a diode;
    a first resistor, one end of the first resistor being connected to the cathode of the diode;
    a metal-oxide-semiconductor field effect transistor (MOSFET), the gate of the MOSFET being connected to another end of the first resistor, and the drain of the MOSFET being grounded;
    a second resistor, one end of the second resistor being connected to the source of the MOSFET;
    and a power supply, being connected to another end of the second resistor.

2. The circuit as recited in claim 1, wherein the MOSFET is a P-channel insulated gate field effect transistor.

3. The circuit as recited in claim 1, further comprising an input end being connected to the anode of the diode, for receiving primary voltage signals.

4. The circuit as recited in claim 1, further comprising an output end being connected to the source of the MOSFET, for outputting translated voltage signals.

5. The circuit as recited in claim 4, wherein voltages of the translated voltage signals correspond to a voltage of the power supply.

6. A circuit for translating signal voltage levels, comprising:
    an input end to receive a first kind of signals with a first preset voltage level;
    an output end to transmit a second kind of signals with a second preset voltage level;
    a first switch connected to said input end;
    and a second switch connected between said first switch and said output end with a switch control end connected to said first switch, a connecting end connected to said output end and a power supply of said second preset voltage level and another connecting end being grounded;
    wherein portions of said first kind of signals are capable of turning on said first switch so as to turn off said second switch in order to generate corresponding portions of said second kind of signals via said power supply, and other portions of said first kind of signals are capable of turning off said first switch so as to turn on said second switch in order to generate other corresponding portions of said second kind of signals via ground signals.

7. The circuit as recited in claim 6, wherein said second switch is a metal-oxide-semiconductor field effect transistor (MOSFET) with a gate thereof as said switch control end, a source thereof as said connecting end to said output end, and a drain thereof as said another connecting end to be grounded.

8. The circuit as recited in claim 7, wherein said MOSFET is a P-channel insulated gate field effect transistor.

9. The circuit as recited in claim 6, wherein one resistor is disposed between said first and second switch, and another resistor is disposed between said power supply and said connecting end of said second switch.

10. The circuit as recited in claim 6, wherein said first switch is a diode.

11. A method for translating signal voltage levels, comprising:

connecting to a first device transmitting a first kind of signals with a first preset voltage level;

connecting to a second device receiving a second kind of signals with a second preset voltage level;

providing a first switch connected to said first device;

and providing a second switch connected to said first switch via a first connecting end thereof and said second device via a second connecting end thereof grounding a third connecting end of said second switch so as to generate portions of said second kind of signals under the condition of turning-on of said second switch due to corresponding portions of said first kind of signals and a corresponding status of said first switch; and supplying an electrical power with said second preset voltage level to said second connecting end so as to generate other portions of said second kind of signals under the condition of turn-off of said second switch due to other corresponding portions of said first kind of signals and another corresponding status of said first switch.

12. The method as recited in claim 11, wherein said second switch is a metal-oxide-semiconductor field effect transistor (MOSFET) with a gate thereof as said first connecting end, a source thereof as said second connecting end, and a drain thereof as said third connecting end to be grounded.

* * * * *